United States Patent [19]
Park et al.

[11] Patent Number: 5,940,116
[45] Date of Patent: Aug. 17, 1999

[54] DEVICE FOR CONNECTING AN OPTION TRAY OF A LASER BEAM PRINTER SIMULTANEOUSLY WITH THE PLACEMENT THEREOF

[75] Inventors: Seo-won Park; Young-gu Kim, both of Seoul, Rep. of Korea

[73] Assignee: SamSung Electronics Co., Ltd., Kyungki, Rep. of Korea

[21] Appl. No.: 08/800,015

[22] Filed: Feb. 13, 1997

[30] Foreign Application Priority Data

Feb. 13, 1996 [KR] Rep. of Korea .................... 96-3501

[51] Int. Cl.⁶ .................................................. G03G 21/16
[52] U.S. Cl. .......................... 347/263; 347/152; 399/110
[58] Field of Search ..................... 347/139, 153, 347/262, 263, 264, 152; 399/110, 391, 393, 176; 439/289, 700, 824

[56] References Cited

U.S. PATENT DOCUMENTS

| | | | |
|---|---|---|---|
| 4,621,272 | 11/1986 | Toriumi et al. | 346/134 |
| 4,636,872 | 1/1987 | Prichard | 358/296 |
| 4,750,729 | 6/1988 | Kanoto et al. | 271/162 |
| 4,779,141 | 10/1988 | Watanabe | 358/401 |
| 4,800,401 | 1/1989 | Sato et al. | 347/242 |
| 4,830,354 | 5/1989 | Penson | 271/147 |
| 4,928,119 | 5/1990 | Walker et al. | 347/263 |
| 5,177,502 | 1/1993 | Schreyer et al. | 347/242 |
| 5,192,958 | 3/1993 | Charnitski | 347/242 |
| 5,294,106 | 3/1994 | Takagi et al. | 271/164 |
| 5,329,229 | 7/1994 | Chiba et al. | 324/248 |
| 5,337,072 | 8/1994 | Gentzke et al. | 347/263 |
| 5,348,497 | 9/1994 | Nitescu | 439/824 |
| 5,482,589 | 1/1996 | Shin et al. | 156/268 |
| 5,513,603 | 5/1996 | Ang et al. | 123/90.37 |
| 5,519,430 | 5/1996 | DeCock et al. | 347/238 |
| 5,583,663 | 12/1996 | Boeve | 358/487 |
| 5,591,152 | 1/1997 | Wirth et al. | 604/385.2 |
| 5,646,721 | 7/1997 | Sugihara et al. | 399/176 |
| 5,666,595 | 9/1997 | Sameshima et al. | 399/110 |

*Primary Examiner*—N. Le
*Assistant Examiner*—Hai C. Pham
*Attorney, Agent, or Firm*—Robert E. Bushnell, Esq.

[57] ABSTRACT

A device connects an optional tray of a laser beam printer simultaneously with the placement of the optional tray. The device has a alignment pin printer terminal projected from a lower surface of a printer body and connected to a CPU in the printer body, a pin hole formed at the position corresponding to the printer terminal on an upper surface of the optional tray, and a tray terminal formed to be applied with the elasticity in the pin hole and connected to a PCB in the optional tray. An elastic member closely connects the tray terminal to the printer terminal when combining the printer body to the optional tray, by elastically supporting the tray terminal.

13 Claims, 5 Drawing Sheets

DEVICE FOR CONNECTING AN OPTION TRAY OF A LASER BEAM PRINTER SIMULTANEOUSLY WITH THE PLACEMENT THEREOF

CLAIM OF PRIORITY

This application makes reference to, incorporates the same herein, and claims all benefits accruing under 35 U.S.C. §119 from an application entitled DEVICE FOR CONNECTING AN OPTION TRAY OF A LASER BEAM PRINTER SIMULTANEOUSLY WITH THE PLACEMENT THEREOF earlier filed in the Korean Industrial Property Office on the 13th day of Feb. 1996, and there duly assigned Ser. No. 96-3501/1996 by that Office.

BACKGROUND OF THE INVENTION

1. Field of the Invention

The present invention relates to a laser beam printer. More particularly, the present invention relates to a device for connecting an optional tray of a laser beam printer simultaneously with the placement thereof.

2. Discussion of Related Art

Typically, a laser beam printer converts an electric signal applied from a computer body, records it onto a paper. The laser beam printer scans the laser beam to a photosensitive drum to generate photo-current, thus performing a printing. Often, such a printer has a paper tray holding a limited number sheets of paper, causing the inconvenience of the need for frequent supply of papers. To solve this problem, development has been made on the auxiliary cassette with a large paper holding space. On this matter, exemplars of the contemporary practice include Wirth et al. (U.S. Pat. No. 5,593,152, Sheet Media Supply Tray Orients Sheets To Registration Posts In Imaging Apparatus, Jan. 14, 1997) discussing a sheet supply tray having a width alignment rail and a registration member against which the side of a received stack of sheets abuts when the stack is fully received in the imaging apparatus. Takagi et al. (U.S. Pat. No. 5,294,106, Image Forming Apparatus Having Detachable Sheet Cassette, Mar. 15, 1994) discussing an image forming apparatus in which probability of sheet jamming is reduced and jammed sheet can be easily removed. Penson (U.S. Pat. No. 4,830,354, Sheet Feed Apparatus And Cartridge Therefor, May 16, 1989) discusses a top-sheet feeding apparatus having an automatically elevating stack support tray to keep the top sheet of the stack in operative contact with sheet feed mechanism. Toriumi et al. (U.S. Pat. No. 4,621,272, Photosensitive Medium Cassette-Receiver System, Nov. 4, 1986) discusses an arrangement for detachably receiving a cassette containing photosensitive film sheets, which is includes a drive device for driving a light shielding cover of the cassette. Based on my study of these examples of the contemporary practice and the art, I find that there is a need for an improved and effective device for connecting an optional tray of a laser beam printer simultaneously with the placement thereof, which can automatically connect a connecting unit of the optional tray to a connecting unit of a printer body simultaneously with the placement of the printer body on the optional tray.

SUMMARY OF THE INVENTION

Accordingly, an object of the present invention is to provide an improved laser beam printer.

Another object is to provide an improved device for connecting an optional tray of a laser beam printer simultaneously with the placement thereof.

A further object is to provide an improved device for connecting an optional tray of a laser beam printer simultaneously with the placement thereof, which can automatically connect a connecting unit of the optional tray to a connecting unit of a printer body simultaneously with the placement of the printer body on the optional tray.

Another object of the present invention is to provide a device which can connect a printer body to an optional tray simultaneously with the placement of the optional tray and has a connecting unit that is not exposed to the outside.

To achieve these and other objects, a device for connecting an optional tray of a laser beam printer simultaneously with the placement thereof includes a guide pin printer terminal projected from a lower surface of a printer body and connected to a CPU in the printer body. The advice may also include a pin hole formed at the position corresponding to the printer terminal on an upper surface of the optional tray, a tray terminal formed to be applied with the elasticity in the pin hole and connected to a PCB in the optional tray; and an elastic member for closely connecting the tray terminal to the printer terminal when combining the printer body to the optional tray, by elastically supporting the tray terminal.

Another device of the present invention includes pin holes formed at a lower surface of a printer body. An alignment guide uses guide pins formed to be inserted into the pin holes and projected from the upper surface of the optional tray. A female mating connector is formed at the lower surface of the printer body and connected to a CPU in the printer body. A connecting mechanism has a male mating connector which can be connected to or separated from the female mating connector and is formed on the upper surface of the optional tray.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENT

Figure 1B:
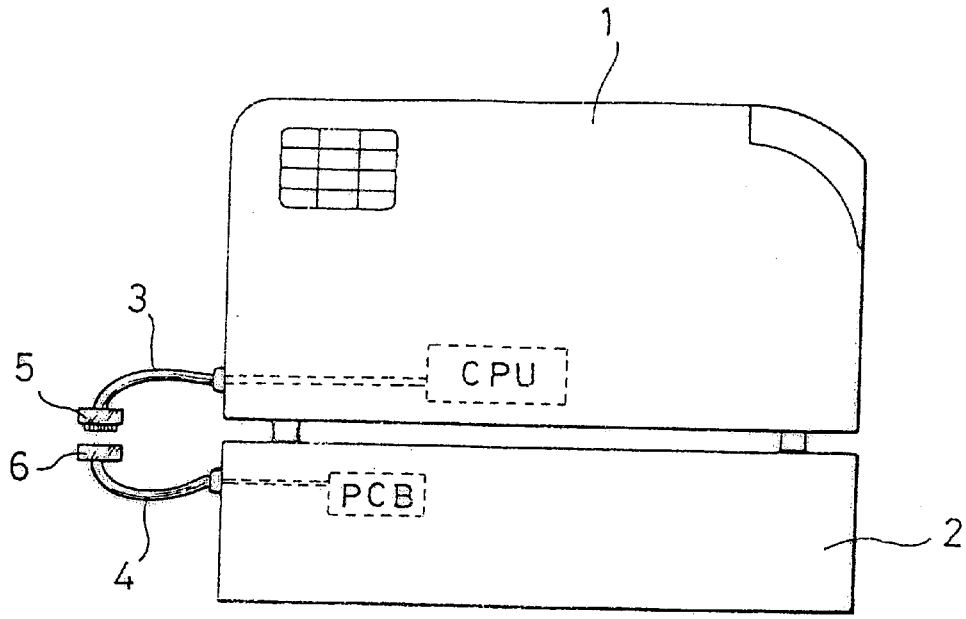
FIG. 1B is a side view showing the placement and connection of an optional tray according to a second contemporary practice.
Figure 1A:
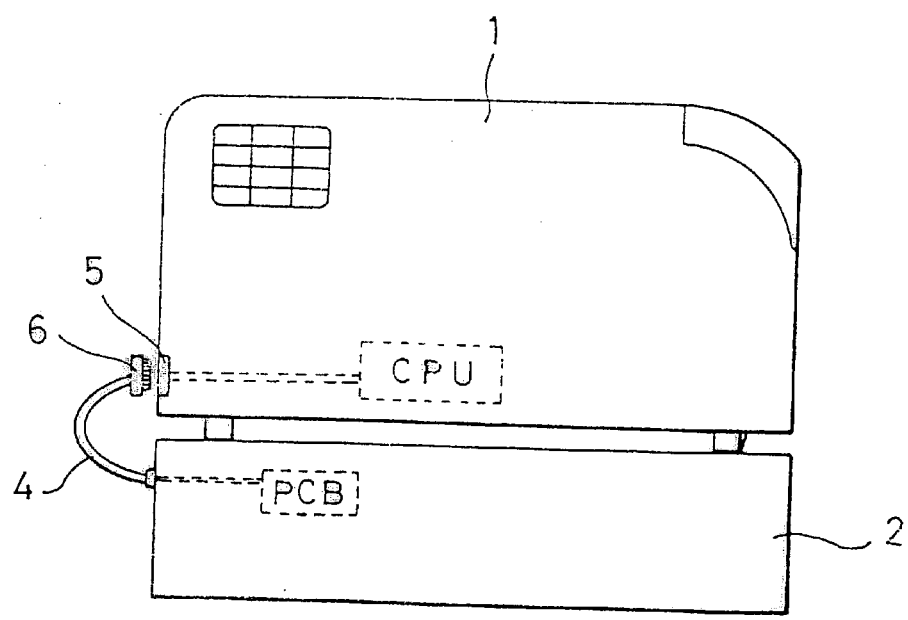
FIG. 1A is a side view showing the placement and connection of an optional tray according to a first contemporary practice.
Figure 2A:
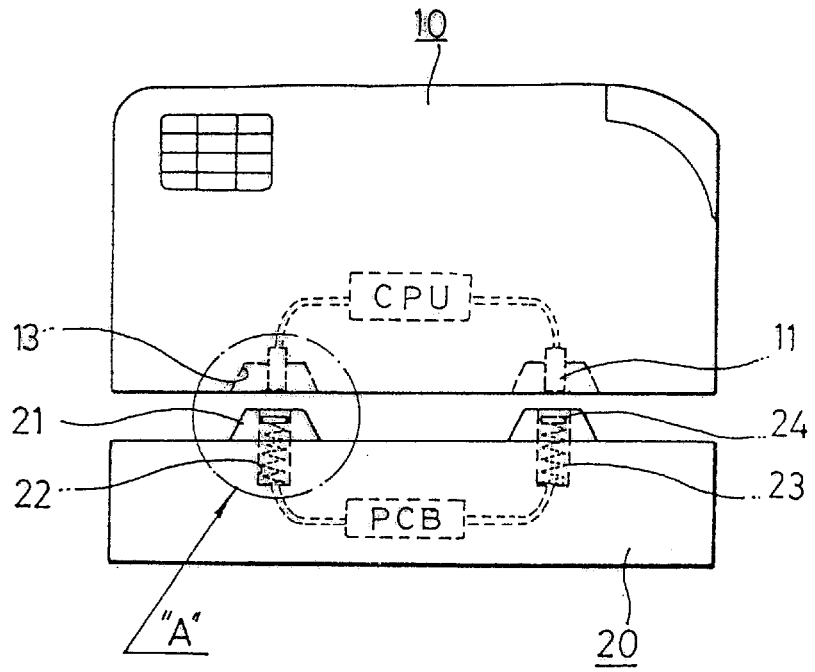
FIG. 2A is a separated side view showing the placement and connection of an optional tray according to a first preferred embodiment of the present invention.
Figure 2B:
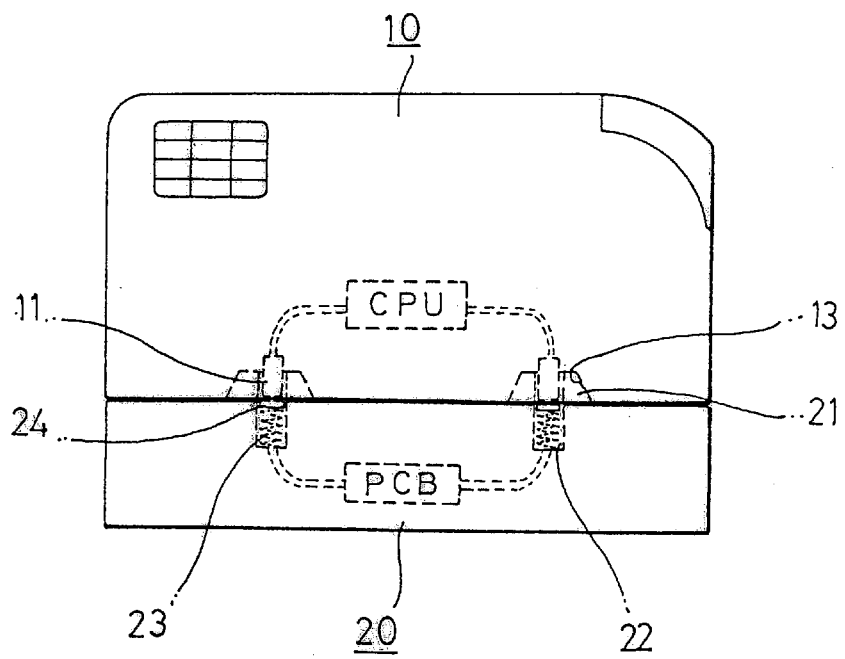
FIG. 2B is a combined side view showing the placement and connection of an optional tray according to a first preferred embodiment of the present invention.
Figure 3:
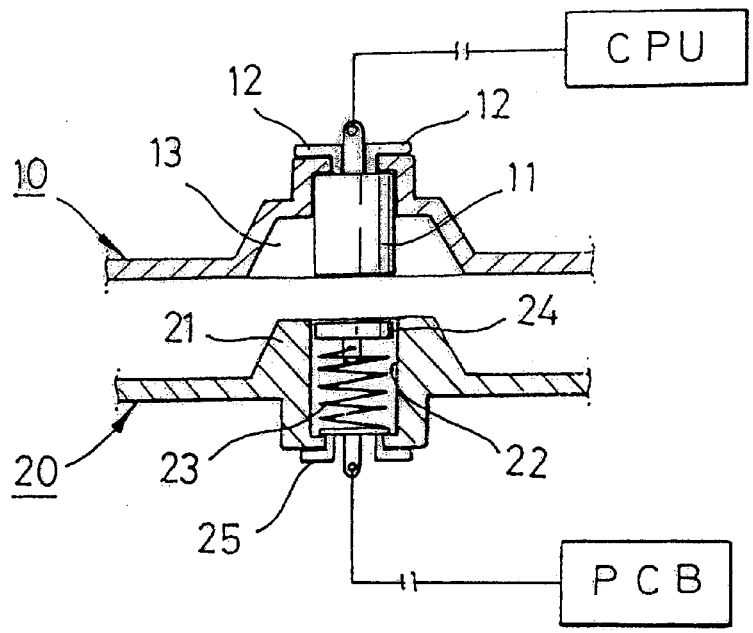
FIG. 3 is an enlarged cross sectional view showing the portion "A" of FIG. 2A.

A printer typically has a paper tray which holds a limited number of papers therein, causing the inconvenience of the need for frequent supply of papers. To solve this problem, a development has been made on the auxiliary cassette with a large capacity for holding cut sheets of paper. Turning now to the drawings, FIGS. 1A and 1B are diagrams showing the connecting relationship of the above described auxiliary cassette (hereinafter referred to as an "optional tray") and printer body. In the figures, the printer body 1 is placed on the optional tray 2, and these are connected by connecting mechanism to allow the optional tray 2 to be operated and controlled by the electric signal applied from the printer body 1. Generally, a connector is used as connecting mechanism for operation of the optional tray 2, and FIGS. 1A and 1B show the first and second contemporary practices using connector connecting mechanism.

Referring to FIG. 1A showing the first contemporary practice, the printer body 1 is placed on the optional tray 2 and these are connected by interlinking a male mating connector 5 connected to the printer body 1 via a cable 3 to a female mating connector 6 connected to the optional tray 2 via a cable 4. In this case, however, the connectors 5 and 6 must be connected by hand after placing the printer body 1 on the optional tray 2, and the cables 3 and 4 including the connectors 5 and 6 are exposed to the outside, causing a bad appearance of the printer. In addition, even when the printer body 1 is used without the optional tray 2, the cable and the connector are still exposed to the outside, thus destroying the design and being burdensome when handled.

FIG. 1B shows an improved connecting mechanism as compared with the first contemporary practice of FIG. 1A. The male mating connector 5 is directly installed at one side of the printer body 1 without using the cable, and the female mating connector 6 connected to the optional tray 2 via the cable 4 is inserted thereto. However, this improved contemporary practice still has the problems of the first contemporary practice of FIG. 1A.

FIGS. 2A to 4 show the first preferred embodiment of the present invention, in which a plurality of guide pin printer terminals 11 are formed at a lower surface of a printer body 10. The guide pin printer terminal also referred to as a first terminal in the claims, 11 is fixed to the printer body 10 by a fixing unit also referred to as a connector in the claims 12, and the guide pin printer terminal 11 can be fixed with other fixing mechanism, not by the fixing unit 12. In addition, the guide pin printer terminal 11 must be formed not to be projected from the lower surface of the printer body 10 because the projection of the guide pin printer terminal 11 may be an obstacle when using the printer body 10 separately. Thus, a fixing groove unit also referred to as a groove in the claims, 13 must be formed around the guide pin printer terminal 11 so that a fixing projection unit also referred to as a plug in the claims, 21 of the optional tray 20 can be inserted thereto. The structure of applicant's interface between terminal 11, including the terminal being recessed into groove 13, and plug 21 allows the printer device to operate without needing any additional positioning pins, guide shafts, or similar guiding and aligning methods to properly align and securely mount the printer body onto the paper tray.

Figure 4:
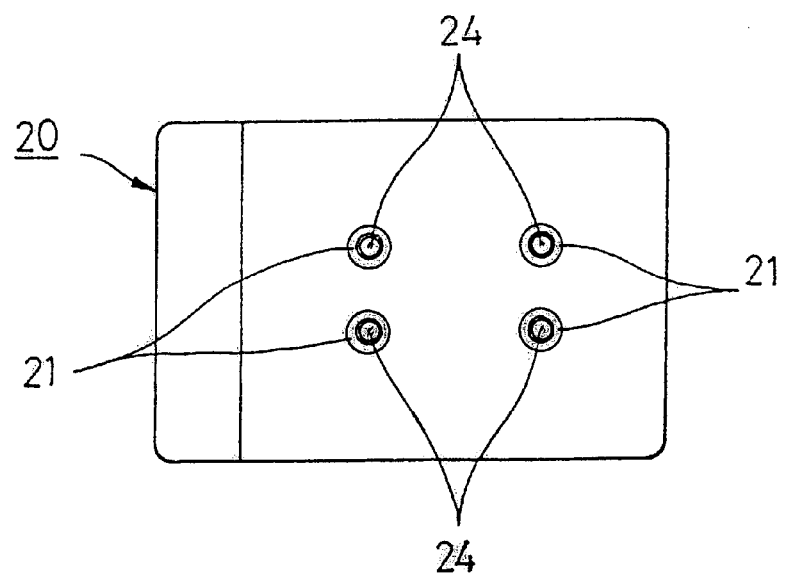
FIG. 4 is a plan view showing an optional tray of the present invention.

At the fixing projection unit 21 is formed a pin hole also referred to as a bore in the claims, 22 into which the guide pin printer terminal 11 is inserted. At the pin hole 22 is formed a tray terminal 24 to which the elasticity is applied in the upper direction by an elastic member 23. A coil spring is used for the elastic member 23 in the figure, but other elastic mechanism can be used if it can apply the elasticity to the tray terminal also referred to as a second terminal in the claims, 24. Thus, the top portion of the elastic member 23 is fixed to the tray terminal 24 and the bottom portion thereof to the fixing member also referred to as a connector in the claims, 25. For the prevention of breakaway, the fixing member 25 is fixed at the bottom of the pin hole 22. The guide pin printer terminal 11 is connected to the CPU in the printer body, and the tray terminal 24 is connected to the PCB in the optional tray 20 via the fixing member 25 and the elastic member 23. In addition, the tray terminals 24 are formed on every side as shown in FIG. 4, and the same number of guide pin printer terminals 11 as that of the tray terminals 24 are formed at the portions corresponding to those of the tray terminals 24, on the lower surface of the printer body 10.

In the first preferred embodiment of the present invention as described above, a user can easily connect the optional tray 20 to the printer body 10 by inserting the fixing projection unit 21 of the optional tray 20 into the fixing groove unit 13 of the printer body 10. With the connection as described above, the guide pin printer terminal 11 of the printer body 10 is inserted into the pinhole 22 of the optional tray 20, thus automatically connected to the tray terminal 24.

At this time, the tray terminal 24 is inserted into the pin hole 22, thus compressing the elastic member 23. Thereby, the elasticity that the elastic member 23 applies in the upper direction is increased and thus the tray terminal 24 which is affected by the elasticity of the elastic member 23 strongly pushes the guide pin printer terminal 11, enabling a close contact thereof In addition, since the printer body 10 is connectedly placed on the optional tray 20 by inserting the guide pin printer terminal 11 into the pin hole 22, this enables a correct placement of the printer body 10 on the optional tray 20 and prevents the breakaway of the printer body 10 from its regular position as far as the printer body 10 is not moved in the upper direction. Further, in the case that the printer body 10 is separately used, because the guide pin printer terminal 11 is inserted into the fixing groove unit 13, the printer terminal 11 may not be an obstacle when placing the printer body 10 on the desk.

Figure 5A:
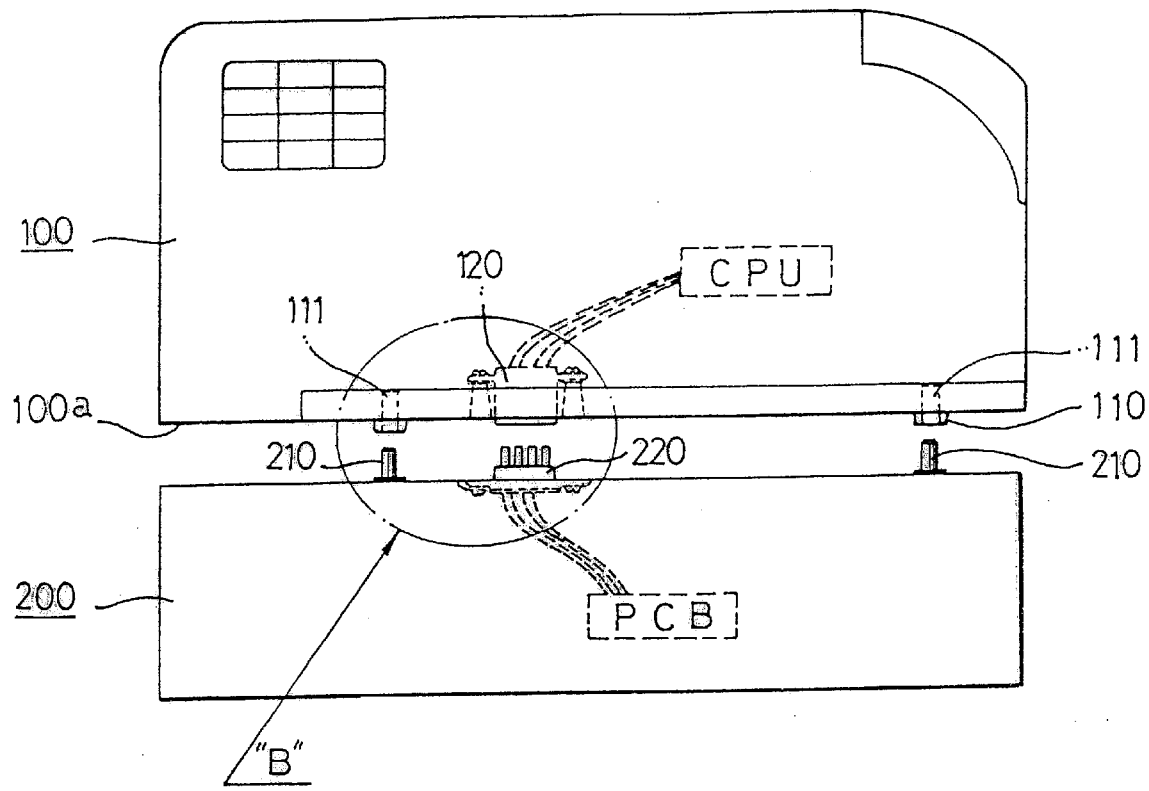
FIG. 5A is a separated side view showing the placement and connection of an optional tray according to a second preferred embodiment of the present invention.
Figure 5B:
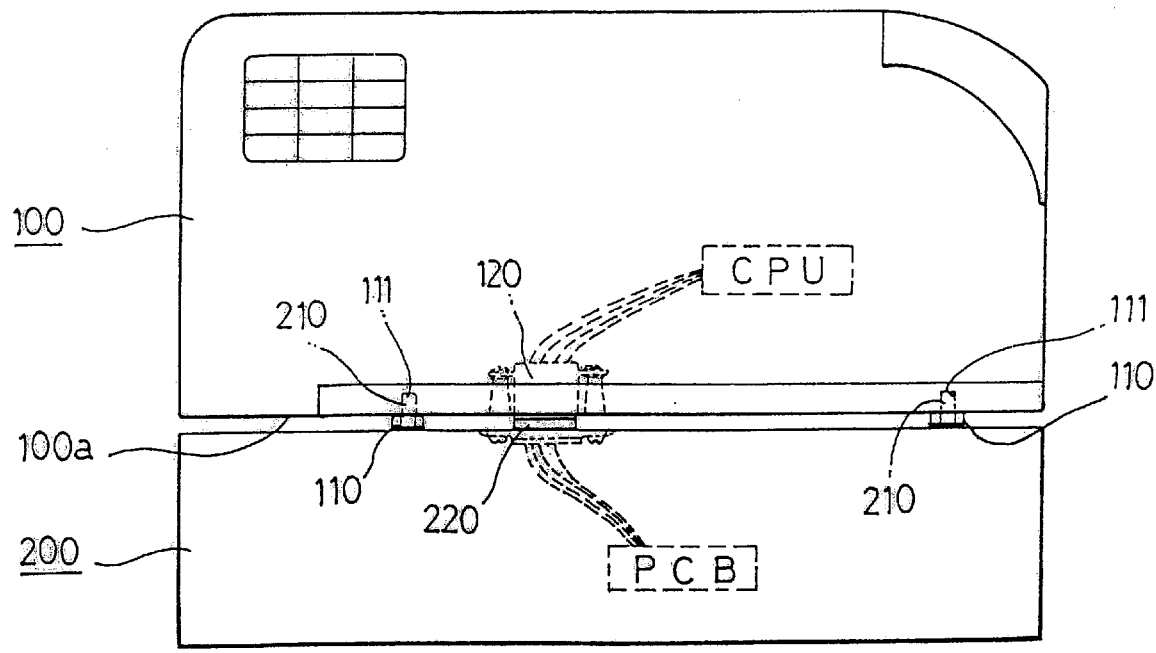
FIG. 5B is a combined side view showing the placement and connection of an optional tray according to a second preferred embodiment of the present invention.
Figure 6:
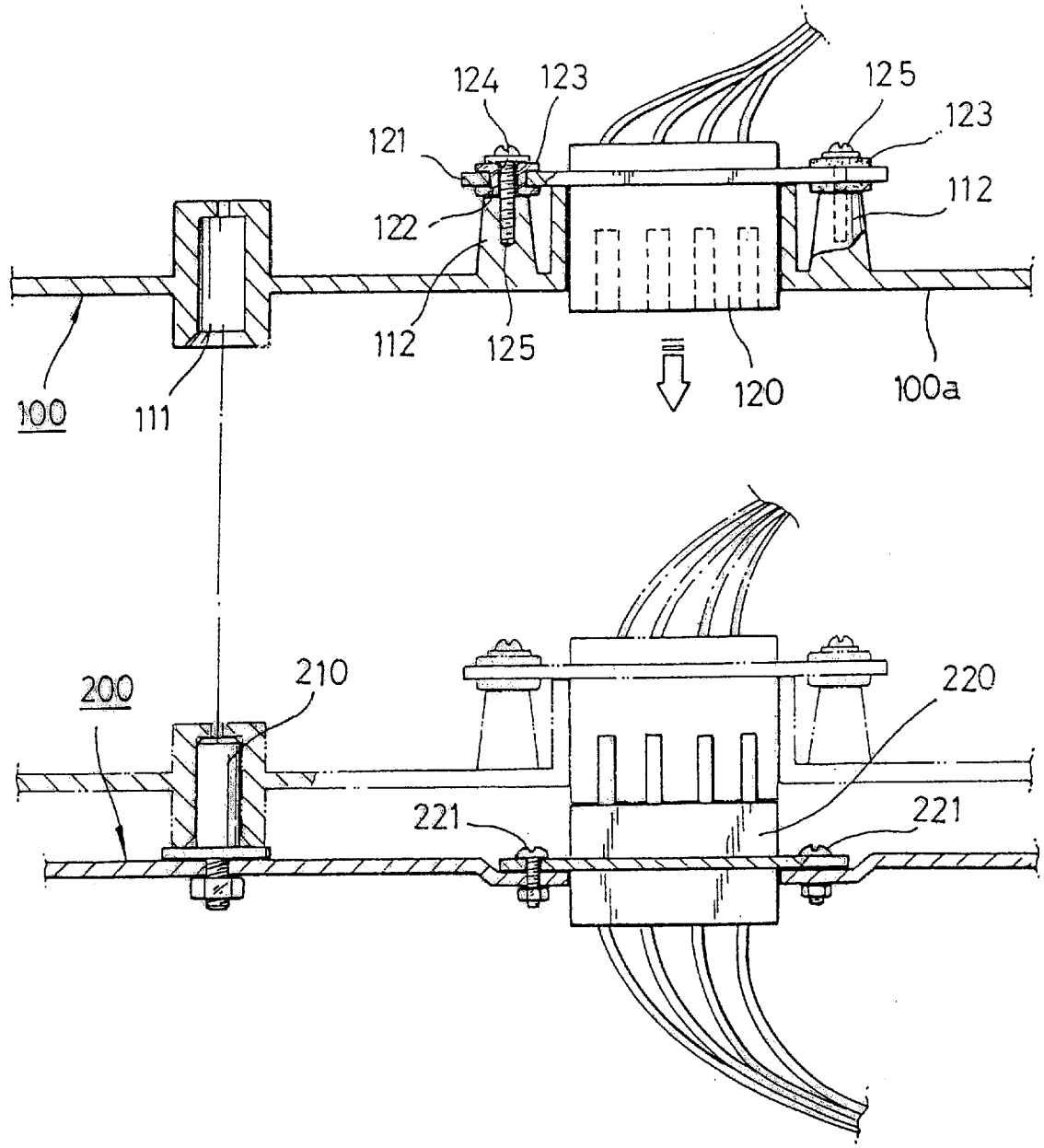
FIG. 6 is an enlarged cross sectional view showing the portion "B" of FIG. 5A.

FIGS. 5A to 6 show a second preferred embodiment of the present invention. A support projection unit 110 is projected from a lower surface 100a of the printer body 100, and a guide groove unit 111 is formed at the support projection unit 110. The support projection units 110 and guide groove units 111 are formed on every side of the lower surface 100a, and a female mating connector 120 is formed at the center thereof The female mating connector 120 has a flange 121 which is fixed to the boss 112 by suspension. Referring to the suspension, a rubber bushing 123 made of flexible material is combined with a through hole 122 of the flange 121, and a fixing screw 125 is passed through a through hole 124 of the rubber bushing 123, thus fixed to the boss 112. A male mating connector 220 is fixed on the upper surface of the optional tray 200 by a screw 221. On every side of the male mating connector 220, guide pins 210 for position fixing are fixed to be projected by fixing mechanism, and the fixing portions of the guide pins 210 correspond to those of the guide groove units 111 formed on the lower surface 100a of the printer body 100. The female mating connector 120 is connected to the CPU in the printer body 100 and the male mating connector 220 to the PCB in the optional tray 200.

The operation of the second preferred embodiment as described above will be discussed herein below. When the optional tray 200 is used, the printer body 100 is placed on the optional tray 200. In this case, the guide pins 210 of the optional tray 200 are inserted into the guide groove units 111 of the printer body 100. While inserting the guide pins 210, force must be applied to the printer body 100. By this force applied to the printer body 100, the male mating connector 220 of the optional tray 200 is connected to the female mating connector 120 of the printer body 100.

During the manufacturing and assembling, there may occur a combining error in the position of the negative and male mating connectors 120 and 220. For this reason, the female mating connector 120 is formed to be slightly movable so as to provide a manufacturing and assembling tolerance. Thus, even though there occurs a combining error while combining the male mating connector 120 to the female mating connector 220, this problem can be solved by slightly moving the female mating connector 220 according to the combining error. The slight movement of the female mating connector 220 is possible due to the flexibility of the rubber bushing 123 even though it is fixed to the fixing screw 125.

When the printer body 100 is separately used, the support projecting unit 110 serves as a support for the printer body 100. In addition, since the support projection unit 110 is more projected than the female mating connector 120, this may not be an obstacle when using the printer body 100 independently. Particularly, the optional tray and the printer body must be assembled at their regular positions, to prevent the fail during the paper feeding.

In the first and second preferred embodiment of the present invention, simultaneously with the combination of the printer body and optional tray at their regular positions, these can be automatically connected to each other, thus enabling a simple usage and enhancing a reliability of the device. In addition, the connecting units of the printer body and optional tray are not exposed to the outside, allowing a clean appearance, and even when the printer body is separately used, there is no obstacle such as a cable, thus enhancing the reliability of the product.

It will be apparent to those skilled in the art that various modifications and variations can be made in the connecting device of the present invention without departing from the spirit or scope of the invention. Thus, it is intended that the present invention cover the modifications and variations of this invention provided they come within the scope of the appended claims and their equivalents.

What is claimed is:

1. A printing device, comprising:
   a printer body enclosing a central processing unit and having a bottom surface, said printer body comprising:
   a groove in said bottom surface; and
   a first terminal positioned in said groove, said first terminal being electrically connected to said central processing unit;
   a tray having a printed circuit board and a top surface and supplying a medium to said printer body, said tray comprising:
   a plug protruding from said top surface and detachably engaged flush with said groove in said bottom surface of said printer body, said plug having a bore for receiving said first terminal of said printer body;
   a second terminal located in said bore in said plug and electrically connected to said printed circuit board, said second terminal being detachably engaged with said first terminal of said printer body; and
   an elastic member biasing said second terminal towards a distal end of said plug and maintaining contact between said first terminal of said printer body and said second terminal while said printer body is positioned on said tray; and
   said printing device being free from alignment means between said tray and said printer body other than said groove and said plug;
   said central processing unit of said printer body being automatically electrically connected to, and in communication with, said printed circuit board of said tray while said printer body is positioned on said tray.

2. The device as claimed in claim 1, further comprised of said first terminal having a distal end flush with said bottom surface of said printer body.

3. The device as claimed in claim 2, wherein said first terminal has a cylindrical shape.

4. The device as claimed in claim 1, further comprised of said groove having a shape of a frustum of cone.

5. The device as claimed in claim 1, wherein said elastic member is a spring.

6. The device as claimed in claim 1, further comprising a connector interfaced with both said first terminal and said central processing unit.

7. The device as claimed in claim 1, further comprising a connector being detachably engaged with both said second terminal and said printed circuit board enclosed in said tray.

8. The device as claimed in claim 1, further comprising:
   a pair of said first terminal each being located in a separate groove in said bottom surface of said printer body; and
   a pair of said second terminal each being located in a separate plug on said top surface of said tray.

9. A printing device, comprising:
   a housing enclosing a central processing unit, having a base, and comprising:
   said base having a groove;
   a pair of bosses integrally formed within a recess of said base; and
   a first connector attached to said pair of bosses and projecting from said base;
   a tray including cassette supplying paper to said housing, said tray containing a printed circuit board, having a top side detachably engaged with said base of said housing, and comprising:
   an alignment pin attached to said top side and detachably inserted into said groove in said base of said housing; and
   a second connector located on said top side of said tray and detachably connected to said first connector; and
   said central processing unit in said housing automatically connecting to said printed circuit board in said tray via operational coupling of said first connector and said second connector when said housing is placed on said tray.

10. The device as claimed in claim 9, further comprising:
   a rubber bushing having a hole; and
   a fixing screw detachably inserted through said first connector, said hole of said rubber bushing, and into one of said pair of bosses.

11. The device as claimed in claim 9, wherein said groove is inside a projection that extends from the base of said housing.

12. The device as claimed in claim 11, wherein a height of said projection is greater than the projection of said first connector beyond said base of said housing.

13. A printing device, comprising:
- a housing enclosing a central processing unit, having a base, and comprising:
  - said base having a plurality of holes;
  - a pair of bosses integrally formed on an inner surface of said base; and
  - a first connector having a first conductor attached to said pair of bosses and projecting from said base;
- a tray including a cassette supplying paper to said housing and containing a printed circuit board, said tray having a top side detachably engaged with said base of said housing, and comprising:
  - a plurality of pins extending upward from said top side for insertion into said holes; and
  - a second connector located on the top side of said tray for engaging said first connector of said housing; and
- said central processor of said housing automatically connecting with said printed circuit board of said tray via operational coupling of said first connector and said second connector when said housing is placed on said tray.

* * * * *